United States Patent
Maass et al.

(10) Patent No.: US 7,799,179 B2
(45) Date of Patent: Sep. 21, 2010

(54) SPUTTERING CATHODE AND DEVICE AND METHOD FOR COATING A SUBSTRATE WITH SEVERAL LAYERS

(75) Inventors: Wolfram Maass, Linsengericht/Grossenhausen (DE); Roland Schneider, Schotten-Michelbach (DE); Uwe Mühlfeld, Wörth (DE); Christoph Mundorf, Kahl (DE); Berthold Ocker, Hanau (DE); Jürgen Langer, Offenbach (DE); Dietmer Schneider, Schöneck (DE); Helmut John, Hanau (DE); Rudi Spielvogel, Wächtersbach (DE); Eric Claussen, Hanau (DE); Wolfgang Stern, Hanau (DE); Helmut Lausmann, Gründau (DE); Matthias Landmann, Mainaschaff (DE); Reinhard Sommerfeld, Bruchköbel-Rossdorf (DE)

(73) Assignee: Singulus Technologies AG, Kahl/Main (DE)

( * ) Notice: Subject to any disclaimer, the term of this patent is extended or adjusted under 35 U.S.C. 154(b) by 520 days.

(21) Appl. No.: 10/504,200

(22) PCT Filed: Feb. 18, 2003

(86) PCT No.: PCT/EP03/01628

§ 371 (c)(1),
(2), (4) Date: Sep. 20, 2004

(87) PCT Pub. No.: WO03/071579

PCT Pub. Date: Aug. 28, 2003

(65) Prior Publication Data
US 2005/0115822 A1    Jun. 2, 2005

(30) Foreign Application Priority Data
Feb. 19, 2002 (EP) .................. 02003752

(51) Int. Cl.
*C23C 14/00* (2006.01)
*C25B 9/00* (2006.01)

(52) U.S. Cl. .................... 204/192.12; 204/298.16; 204/298.23

(58) Field of Classification Search .......... 204/192.1, 204/192.12, 192.2, 298.11, 298.12, 298.15, 204/298.16, 298.23
See application file for complete search history.

(56) References Cited

U.S. PATENT DOCUMENTS 4,155,825 A * 5/1979 Fournier ................. 204/192.13

(Continued)

FOREIGN PATENT DOCUMENTS

JP     57-78123     5/1982

(Continued)

OTHER PUBLICATIONS

Patent Abstracts of Japan, vol. 017, No. 589 Oct. 27, 1993, JP 05 171432 A, Jul. 9, 1993.

(Continued)

*Primary Examiner*—Luan V Van
(74) *Attorney, Agent, or Firm*—Ohlandt, Greeley, Ruggiero & Perle, LLP; George W. Rauchfuss, Jr.; Charles N. J. Ruggiero

(57) ABSTRACT

The invention relates to a sputtering cathode (1) for coating a substrate (6), which comprises a device (5) for generating an external magnetic field with substantially parallel magnetic field lines (8) substantially in the plane of the substrate. The invention further relates to a device and a method for coating a substrate with several layers, whereby several sputtering cathodes are disposed in a circle with their target effective areas pointing radially outward.

19 Claims, 3 Drawing Sheets

U.S. PATENT DOCUMENTS

| | | | | |
|---|---|---|---|---|
| 4,443,318 | A * | 4/1984 | McKelvey | 204/298.23 |
| 4,581,118 | A * | 4/1986 | Class et al. | 204/298.16 |
| 4,601,806 | A | 7/1986 | Wirz | 204/298 |
| 4,798,660 | A * | 1/1989 | Ermer et al. | 204/192.17 |
| 4,851,095 | A * | 7/1989 | Scobey et al. | 204/192.12 |
| 4,871,433 | A * | 10/1989 | Wagner et al. | 204/192.12 |
| 5,266,178 | A | 11/1993 | Sichmann | 204/298.19 |
| 5,490,913 | A * | 2/1996 | Schertler et al. | 204/298.2 |
| 5,618,388 | A * | 4/1997 | Seeser et al. | 204/192.12 |
| 5,630,916 | A * | 5/1997 | Gerrish et al. | 204/192.2 |
| 5,746,897 | A | 5/1998 | Heimanson et al. | 204/298.2 |
| 5,804,041 | A * | 9/1998 | Hurwitt | 204/192.2 |
| 5,922,182 | A | 7/1999 | Maass et al. | 204/298.15 |
| 6,217,272 | B1 | 4/2001 | Felsenthal et al. | 414/217 |
| 6,249,200 | B1 * | 6/2001 | Stelter et al. | 335/302 |
| 6,328,858 | B1 * | 12/2001 | Felsenthal et al. | 204/192.15 |
| 6,440,202 | B1 | 8/2002 | Xu et al. | 204/298.2 |
| 6,790,482 | B2 * | 9/2004 | Maass | 427/445 |
| 6,905,578 | B1 * | 6/2005 | Moslehi et al. | 204/192.12 |
| 2001/0009221 | A1 * | 7/2001 | Anzaki et al. | 204/192.12 |

FOREIGN PATENT DOCUMENTS

| | | |
|---|---|---|
| JP | 5-171432 | 7/1993 |
| JP | 2001-26870 | 1/2001 |
| JP | 2001-73133 | 3/2001 |

OTHER PUBLICATIONS

Patent Abstracts of Japan, vol. 013, No. 174 Apr. 25, 1989, JP 01 004472 A, Jan. 9, 1989.

* cited by examiner

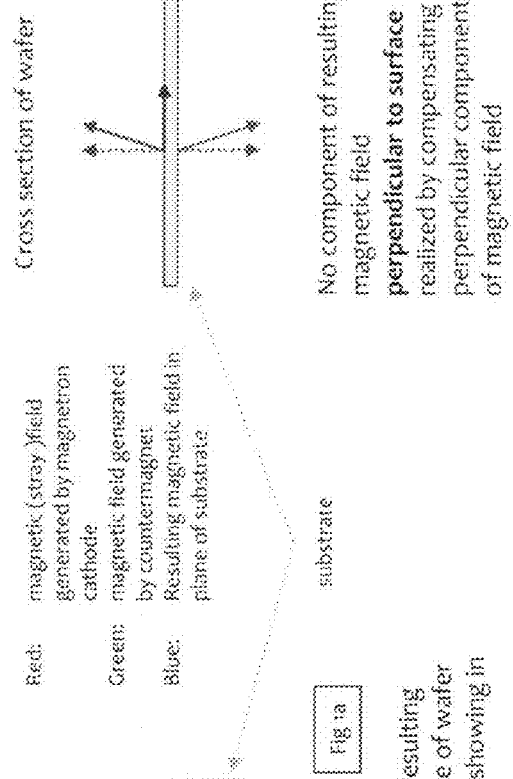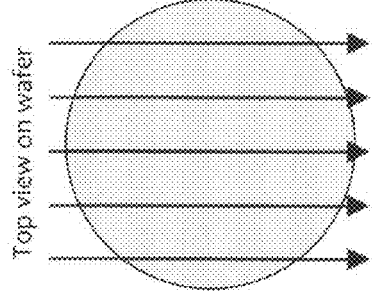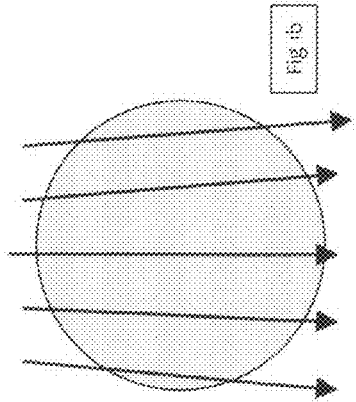

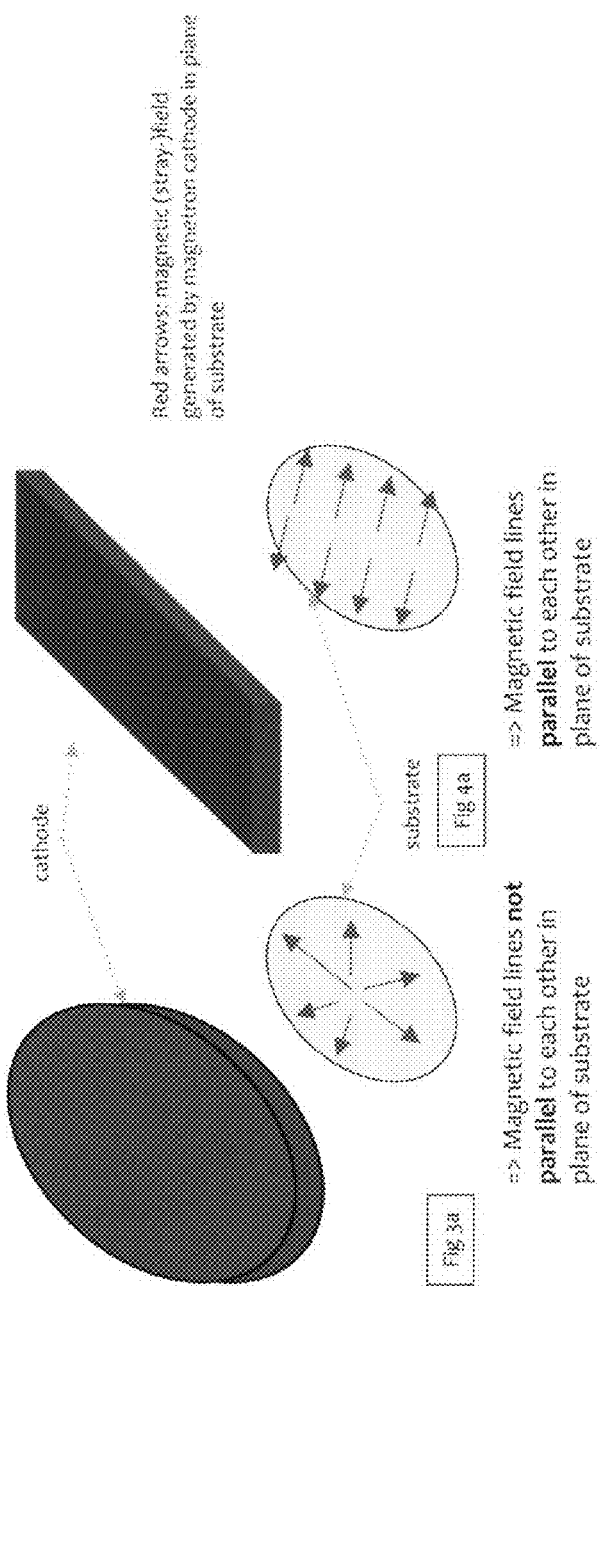

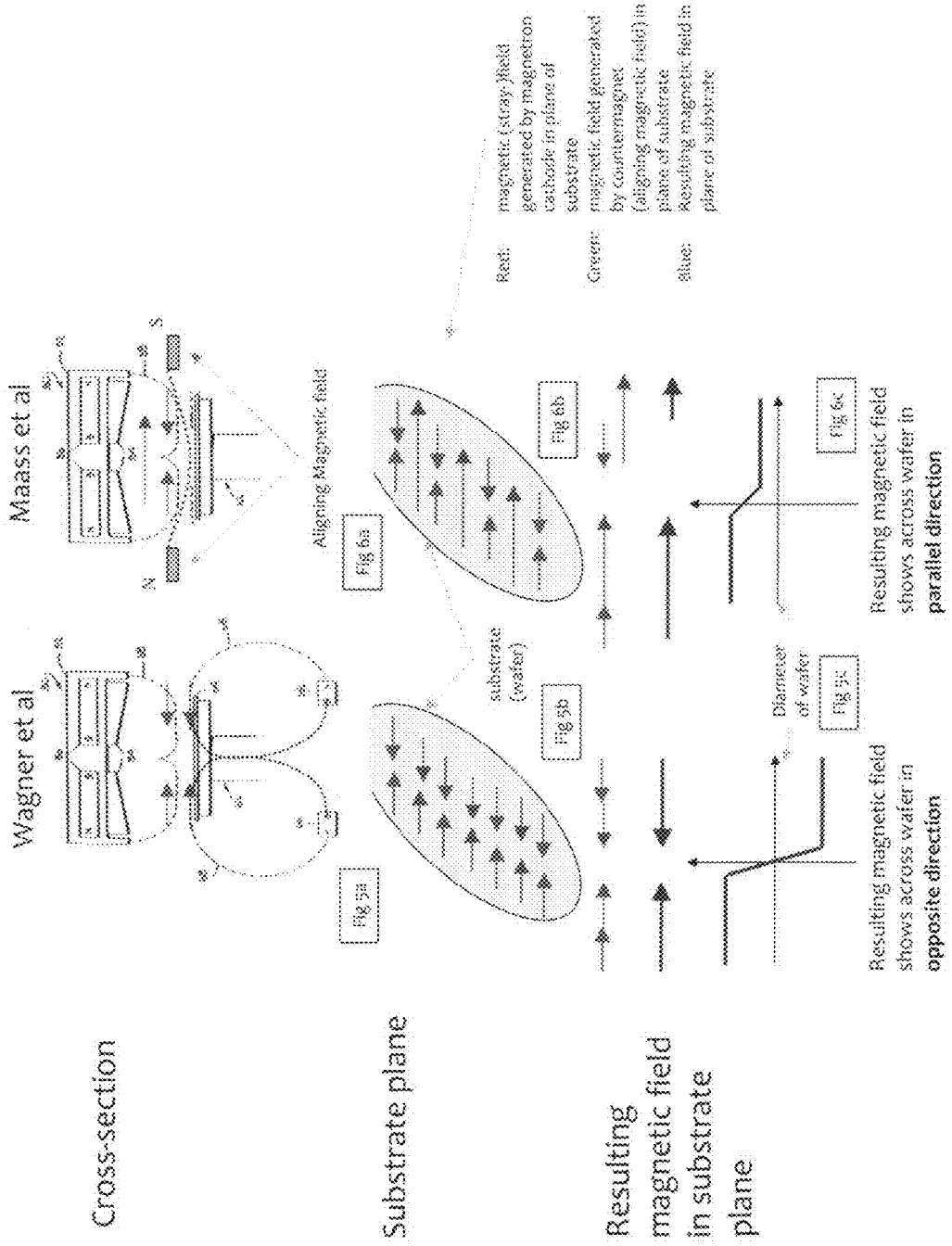

SPUTTERING CATHODE AND DEVICE AND METHOD FOR COATING A SUBSTRATE WITH SEVERAL LAYERS

The invention relates to a sputtering cathode for coating a substrate, in particular with magnetic and/or magnetizable materials. The invention further relates to a device and a method for coating a substrate by means of cathode sputtering, in particular with magnetic materials.

DE-A-196 43 841 discloses a device for coating substrates, in particular with magnetizable materials. Said device consists of a disk-shaped, rotatably supported substrate holder for receiving at least one substrate which, on its side facing away from the substrate and along its periphery, is provided with a concentric dark space shield, a means for generating an outer field being parallel to the substrate plane, as well as at least one cathode under which the substrate holder rotates during the coating process. The outer field of said device is generated by an electromagnet having a yoke, wherein the lower yoke part with the excitation coil is arranged in the dark space shield, and its elongated pole shoes are arranged in an electrically separated manner in the substrate carrier close to the substrate. Inserted in the substrate holder, the substrate is rotated under the cathode and coated with the target material during dynamic operation of said device.

DE-A-41 35 939 discloses a rotationally symmetrical sputtering cathode which can also be configured as an elongated or long cathode. When said sputtering cathode is configured as a long cathode, the substrate is coated when moving it relative to the cathode.

Further prior art documents are WO 97/03220 A, EP 1 067 577 A, U.S. Pat. No. 4,601,806 A, U.S. Pat. No. 5,630,916 A, U.S. Pat. No. 6,217,272 B1, JP-05-171432 A and JP-01-004472 A.

The so-called MRAM (magnetic random access memory) is more and more used in memory or storage technology as a non-volatile memory or storage. In these storage devices, the information to be stored is stored in the magnetization direction of a particle of a magnetic coating. There are two alternative methods of reading out the information, namely the so-called TMR (tunnel magneto resistance) effect and the so-called GMR (giant magneto resistance) effect.

For this kind of storage it is necessary to provide extremely thin layers (on the order of few Å) which are extremely uniformly applied to a substrate. The storage capacity of this extremely thin layer is achieved by magnetizing the layer on the substrate. The easy magnetization axis of the magnetic material, e.g. a ferromagnetic material, is aligned in one direction over the entire area of the substrate. Deviations ranging at most between +/−2° are allowable when aligning the easy magnetization axis.

Moreover, it is necessary for such magnetic storages to apply up to ten or more layers on one another.

By means of the sputtering cathodes known so far, it is not possible to produce such extremely thin layers with the necessary accuracy as regards the alignment of the easy magnetization direction. The use of rotationally symmetrical sputtering cathodes is, e.g., disadvantageous in that the rotationally symmetrical magnetic field in the sputtering cathode, which is necessary for the sputtering, disturbs the alignment of the easy magnetization axis in the substrate layers in one direction.

It is a further disadvantage of rotationally symmetrical magnetron sputtering cathodes that, with the required layer thicknesses of few Å, the required extreme homogeneity and uniformity cannot be achieved.

It is a further problem related with the production of magnetizable layers, in particular for MRAM, on a substrate that an extremely high vacuum is required in order to be able to apply the extremely thin layers to the substrate as extremely uniformly as required.

It is the object of the invention to provide a sputtering cathode which allows the easy magnetization axis of a magnetizable material to be aligned during the application of the material to a substrate.

Furthermore, it is intended to provide a device and a method for coating a substrate with a plurality of layers of the same material or of different materials by means of cathode sputtering, and which is suitable for providing the plurality of thin layers of different materials, which are necessary for magnetic storages, as extremely uniformly as required.

In accordance with the invention, this object is achieved with the features of the claims.

For applying magnetic materials to substrates, thereby achieving the necessary alignment of the easy magnetization axis of the material, the invention starts out from the basic idea of providing a sputtering cathode with a means for generating an external magnetic field, wherein the magnetic field has essentially parallel magnetic field lines which essentially lie in the plane of the substrate to be coated. Preferably, the strength of the external magnetic field can be varied in accordance with the magnetic material used, so that when aligning the easy magnetization axis in the magnetic layer, the material used can be taken into consideration.

More preferably, the sputtering cathode according to the invention is a long cathode. The use of a long cathode is advantageous in that the stray fields caused by the magnet arrangement do not extend rotationally symmetrical but overlap the essentially parallel magnetic field lines of the external magnetic field, so that these stray fields only play a minor role in the alignment of the magnetic particles. Moreover, the use of a long cathode leads to the advantage that the substrate to be coated can be easily moved under the target in its plane and perpendicular to the longitudinal direction of the long cathode. This difference vis-à-vis the prior art (in which the magnetic field is moved together with the substrate), i.e. the stationary external magnetic field of the invention, leads to the specific advantage that upon a relative movement of the substrate under the target and through the external magnetic field, on the one hand, an easy and exact alignment of the easy magnetization axis can be achieved and, on the other hand, the desired small layer thickness of the material to be applied can be adjusted easily independent of the power of the sputtering cathode. With this kind of coating, the speed of the substrate determines the thickness of the layer to be applied.

In the preferred embodiment, in which the sputtering cathode is a long cathode, the external magnetic field generation means extends along the lengthwise direction or longitudinal direction of the target of the long cathode. This means that along the entire length of the target an external magnetic field can be aligned essentially perpendicular to the longitudinal direction of the target and essentially in the plane of the substrate, so that the easy magnetization axis of a material being applied to a substrate which is moved relative to the target can be aligned in the direction of the external magnetic field.

Since the substrate is necessarily arranged at a certain distance from the target during the coating process, a shield is preferably provided between the target and the substrate for shielding the area of the cathode which should not be coated.

Preferably, there is also a means for relatively moving the substrate with respect to the cathode during the cathode sputtering process. More preferably, this moving means provides for a translatory relative movement of the substrate with respect to the cathode.

In the sputtering cathode according to the invention, the cathode base body with the target arranged thereon is more preferably located in a process chamber, while the magnet arrangement allocated to the cathode base body and the target is not provided in said process chamber but is separated therefrom by means of a wall and located in the ambient atmosphere. This arrangement is particularly advantageous for providing the ultrahigh vacuum which is necessary during the coating of substrates for the provision of magnetic storages. By this preferred embodiment, i.e. separation between target and magnet arrangement, it is possible to make the openings towards the process chamber much smaller because only cooling fluid and current for the cathode have to be supplied to the process chamber. However, it is possible to combine them, so that only this combined supply has to be sealed in the preferred embodiment. Thus, much smaller sealing lengths are possible (so far, they were approximately one meter per target).

The device according to the invention for coating a substrate with several layers of different materials by means of cathode sputtering, in particular with magnetic or magnetizable materials, is characterized in that an arrangement is provided which consists of several sputtering cathodes, each having a cathode base body, each being provided with a target made of the respective material and each having a magnet arrangement being located behind each target, wherein the several sputtering cathodes are disposed on a circle with their respective target effective areas pointing radially outward and the sputtering cathode arrangement is rotatable around the center of said circle relative to the substrate. The substrate is essentially arranged in a tangential plane of a circle surrounding the sputtering cathode arrangement.

This arrangement according to the invention in which several sputtering cathodes, which are necessary for the application of several different layers to the substrate, are arranged in the form of a circle or in the form of a drum makes it possible to achieve a very high uniformity and homogeneity during the application of the several layers, because the substrate can be maintained in its plane during the various coating steps, while the different targets can be rotated into the respective sputtering positions. The arrangement of the sputtering cathodes in the form of a target drum is further advantageous in that the entire coating device is very compact. Such a target drum can be attached easily to conventional substrate supplying modules, for example in a lying position, i.e. with a horizontal longitudinal axis.

The sputtering cathodes are preferably long cathodes. The above statements are correspondingly applicable with respect to the related advantages.

More preferably, the coating device according to the invention comprises an external magnetic field generation means whose magnetic field lines extend essentially parallel and in the plane of the substrate. Thus, the magnetic particles are aligned with respect to their easy magnetization axis; the above statements are correspondingly applicable with respect to the related advantages.

The external magnetic field generation means is stationary relative to the sputtering cathode arrangement, i.e. the sputtering cathode arrangement can be rotated relative to the magnetic field generation means. Depending on the target used, the latter is rotated in the coating direction by rotating the sputtering cathode arrangement in the sputtering position relative to the substrate and is thus in the sphere of influence of the external magnetic field which acts on the layer that is applied from the presently used target to the substrate.

Preferably, in the coating device according to the invention it is not necessary that each sputtering cathode and/or each target has a separate magnet arrangement for the generation of the magnetron magnetic field; rather, there is/are only one or two magnet arrangement(s) which can selectively be placed over the target to be used. This allows a further compaction of the coating device according to the invention, i.e. the target drum can have a relatively small diameter because in the interior there has to be space for one or optionally two magnetron magnet arrangement(s) only. For example, different magnet arrangements can thus be provided or used for magnetic and non-magnetic target materials.

The method according to the invention for coating a substrate by means of cathode sputtering, in particular by means of a sputtering cathode according to the invention, is characterized in that during the sputtering process an external magnetic field is provided, wherein the magnetic field lines thereof extend essentially parallel and in the plane of the substrate.

In the method for coating a substrate with several layers, in particular with magnetic materials, preferably a substrate is moved by a translatory movement relative to a sputtering cathode essentially in the plane of the substrate, and thus a layer is applied to the substrate. This preferred movement of the substrate relative to the cathode can preferably be repeated several times if this is necessary for achieving a required layer thickness. The sputtering cathode is subsequently replaced with a different sputtering cathode having a target of a different material by rotating the drum, and the previous steps are repeated.

The invention is particularly suitable for multilayer coatings consisting of many different materials even outside the field of application of the MRAM technology.

In the following, the invention will be described in detail with reference to the drawings in which FIG. 1 is a schematic sectional view of a sputtering cathode according to the invention in the form of a long cathode;

FIG. 2 is a schematic view of the alignment of the easy magnetization axis of a ferromagnetic material on a substrate;

FIG. 3 is a sectional view of the substrate coating device according to the invention with long cathodes;

FIG. 4 is a sectional view of the preferred separation of the magnet arrangement and target according to the invention;

FIG. 5 is a schematic overview of a complete coating arrangement comprising two coating devices according to the invention; and FIG. 6 is a schematic oblique view of the moving means for the translatory movement of the substrate.

FIG. 1 is a cross-sectional view and shows the principle structure of the sputtering cathode 1 according to the invention with a long cathode whose longitudinal axis is perpendicular to the drawing plane. The sputtering cathode 1 according to this preferred embodiment has a cathode base body 2 with a target 3 located thereon. Between target 3 and cathode base body 2 there are cooling channels 9 for a cooling fluid. On the side of the cathode base body facing away from the target, a magnet arrangement 4 is provided whose magnetic field MF, i.e. the magnetron field, is shown below the target. The substrate 6 is spaced from the target 3. In the embodiment shown, the substrate 6 is located in a plane being essentially parallel to the target 3. Alternatively, the plane of the substrate can also be slightly inclined with respect to the plane of the target 3.

Moreover, a means 5 for generating an external magnetic field in the area of the substrate is provided. In FIG. 1, only the two pole shoes 5' of this means are shown; said pole shoes 5' are electromagnetically connected with a coil arrangement (not shown). Said magnetic field generation means 5 generates an external magnetic field whose field lines 8 are shown in FIG. 1 between the pole shoes 5'. The magnetic field lines 8 of said external magnetic field or directional magnetic field essentially extend in the plane of the substrate 6 and therein essentially parallel with each other, so that the desired parallel alignment of the easy magnetization axis MA is achieved in the substrate 6.

Furthermore, a shield 7 between the target 3 and the substrate 6 shields components of the sputtering cathode that should not be coated against the sputtered target material; said shield 7 only forms a residual area of the process chamber between target and substrate.

The desired alignment of the easy magnetization axis MA is achieved with the sputtering cathode 1 according to the invention, namely both if the substrate 6 is moved during the coating process in its plane and essentially in the direction of the magnetic field lines 8 relative to the target, and also if the substrate 6 rests under the target 3 during the coating process.

An optimum alignment of the easy magnetization axis is achieved in particular if a long cathode is used because in this case the stray magnetic fields of the magnetron magnet arrangement 4 already overlap the magnetic field 8 of the external magnetic field generation means 5. In the case of a rotationally symmetrical sputtering cathode or magnet arrangement 4, the stray magnetic field would not overlap the magnetic field of the external magnetic field generation means 5, which would possibly lead to a deteriorated alignment of the easy magnetization axis. However, also such and other non-long-cathode arrangements form part of the scope of the invention.

The alignment of the easy magnetization axis MA is schematically shown in FIG. 2. The alignment of the easy magnetization axis shown in FIG. 2, i.e. uniformly in one direction, is particularly important if the substrate to be coated is to be used as a magnetic storage, in particular as an MRAM material.

FIG. 3 schematically shows a side view of the device 10 for coating a substrate 6 with several layers of different materials by means of cathode sputtering according to the invention. The upper part of the Figure shows the sputtering cathode arrangement 11 with the plurality of sputtering cathodes 11-1, 11-2, . . . , 11-n. The sputtering cathodes are located on a circle with their target effective areas pointing radially outward, wherein the sputtering cathode arrangement 11 or target drum can be rotated around the center of said circle within a drum housing TG relative to the substrate. The substrate 6 can be moved within a housing G on a substrate holder 12 in the direction of arrow P relative to the sputtering cathode arrangement, i.e. the target drum 11, horizontally and parallel with respect to the target surface of the target 3-i. The sputtering cathode 11-i, which is presently used for the coating, is arranged together with the target 3-i at the lowermost position in the target drum 11, i.e. above the coating position of the substrate 6. The drum housing TG and the housing G together form a vacuum chamber which is evacuated via pumps (e.g. turbo molecular pumps TP).

Optionally, depending on the desired layer thickness, one or more layers of the material to be sputtered from the target 3-i are applied to the substrate 6 by moving the substrate 6 once or several times horizontally below the target 3-i.

When sputtering with the target 3-i is finished, the target drum is rotated around its axis 15 until the sputtering cathode with the target with the different target material that is desired next has reached the sputtering position, i.e. the lowermost position of the target drum 11. Then the substrate 6 is optionally again once or several times moved below the target in order to apply a layer.

A shielding sheet 19 as well as the shield 7 serve the purpose of shielding the environment against sputtered, unused target material.

If it is intended to also magnetize a layer applied to the substrate by means of the device according to the invention, a magnetic field generation means 5, as explained in connection with FIG. 1, is also provided in accordance with the invention. If necessary, said means is activated.

A multi-piece robot arm 13, which allows an extremely exact linear movement of the substrate relative to the target drum 11, is provided for moving the substrate holder 12 with the substrate 6. A transporting unit (not shown) transports the substrate 6 to the substrate holder 12 at the robot arm 13 and again away therefrom.

Depending on the field of application, the target drum 11 comprises several sputtering cathodes with targets. Eight or ten sputtering cathodes are preferred.

The targets 3-1 to 3-n of the different sputtering cathodes 11-1, 11-2, . . . , 11-n consist of different materials corresponding to the desired composition of the layers to be applied to the substrate 6.

FIG. 4 shows the separation of target 3 and magnetron magnet arrangement according to the invention. The drum wall 17 of the target drum has only a small opening for water and current supply. The target 3 is provided on a base plate, e.g. a copper plate 14, inside the process chamber. According to the invention, the magnetron magnet arrangement 4 (in FIG. 4 only shown schematically) is separated from the process chamber and arranged outside the drum wall 17 (i.e. radially within the ring-shaped drum 11). The distance between target 3 and magnetron magnet arrangement 4 is preferably as small as possible.

FIG. 4 also shows insulating strips 16 which electrically insulate the cathode against the drum wall 17 and which also seal the evacuated process chamber against the interior of the drum 18 which is under normal pressure.

FIG. 5 shows a schematic top view of a complete coating assembly comprising two coating devices 10 according to the invention being coupled to a supply module 30. The substrates to be coated are introduced by the supply module 30 into the coating devices 10 and are subsequently provided with the respective coatings in the coating devices. As shown in FIG. 5, the axes 15 of the target drums 11 are arranged perpendicular with respect to the movement directions (arrows A and B) of the substrates from the supply module 30 into the coating device 10. It has already been explained that in the coating device 10 the substrate 6 is moved below the target 3-i which is located at the lowermost position. Depending on the desired coating structure on the substrate, the target drum 11 is subsequently rotated around the axis 15 in such a manner that the following desired target is arranged above the movement path of the substrate 6 for coating the latter.

FIG. 5 furthermore shows two additional modules 20 by means of which coated or uncoated surfaces of the substrate can be further treated. For example, a surface can purposively be oxidized or optionally be smoothed.

FIG. 6 shows, similar to FIG. 3, a sectional view of a component of the coating device according to the invention, i.e. the moving means (without housing G) for moving the substrate 6 below the target drum. FIG. 6 also shows the multi-piece robot arm which allows an exact linear movement of the substrate 6 relative to the target.

The invention claimed is:

1. A sputtering cathode (1) for coating a substrate (6), with magnetic or magnetizable materials, comprising:
   a cathode base body (2);
   a target (3) arranged thereon;
   a magnet arrangement (4) provided behind the target (3) and intended for generating a magnetron field;
   a means (5) for generating a stationary external magnetic field having magnetic field lines (8) which extend essentially parallel with each other in the same direction and essentially in the plane of the substrate (6); and
   a means (13) for moving the substrate (6) during coating in its plane with respect to the target (3) essentially in the direction of the magnetic field lines (8) of the external magnetic field.

2. The cathode according to claim 1, wherein the cathode (1) is a long cathode.

3. The cathode according to claim 1, wherein the external magnetic field aligns an easy magnetization axis of a material being applied to the substrate (6).

4. The cathode according to claim 2, wherein the external magnetic field generation means (5) extends in a longitudinal direction of the target (3).

5. The cathode according to claim 1, further comprising a shield (7) for shielding an area of the cathode (1) which should not be coated between the target (3) and the substrate (6).

6. The cathode according to claim 1, comprising a means for a particularly linear relative movement of the substrate (6) with respect to the cathode (1) in the substrate plane during cathode sputtering.

7. A sputtering cathode, in particular according to claim 1, wherein the cathode base body (2) with the target (3) provided thereon is arranged in a process chamber and the magnet arrangement (4) is separated therefrom by means of a wall and located in an ambient atmosphere.

8. The sputtering cathode according to claim 1, wherein strength of the external magnetic field is adjustable.

9. A device (10) for coating a substrate (6) with several layers by means of cathode sputtering, with magnetic or magnetizable materials, comprising:
   a cylindrical cathode sputtering arrangement (11) comprising a plurality of sputtering cathodes (11-1, 11-2, . . ., 11-n) each having a cathode base body (2, 14), a target (3-1, 3-2, . . ., 3-n) arranged thereon to provide a target effective area, and a magnet arrangement (4) provided behind the target (3) and intended for generating a magnetron field;
   wherein the plurality of sputtering cathodes are located on a circle with their target effective areas pointing radially outward, and the sputtering cathode arrangement (11) can be rotated around an axis (15) relative to the substrate (6) which is essentially arranged in the tangential plane of a circle enclosing the sputtering cathode arrangement (11);
   a means (5) for generating a stationary external magnetic field having magnetic field lines (8) which extend essentially parallel with each other in the same direction and essentially in a plane of the substrate (6); and
   a means (13) for moving the substrate (6) during coating in its plane with respect to target (3) essentially in the direction of the magnetic field lines (8) of the external magnetic field.

10. The device according to claim 9, wherein the sputtering cathodes are long cathodes.

11. The device according to claim 9, wherein the external magnetic field aligns an easy magnetization axis of a material being applied to the substrate (6).

12. The device according to claim 10, wherein the magnetic field generation means (5) extends in the longitudinal direction of the targets (3).

13. The device according to claim 9, further comprising a means for a particularly translatory relative movement of the substrate (6) in the substrate plane and with respect to the sputtering cathode arrangement (11) during cathode sputtering.

14. The device according to claim 9, wherein the cathode base bodies (2) with the targets (3) arranged thereon are provided in a process chamber and the magnetron magnet arrangements (4) are separated therefrom by means of a wall (17) and located in an ambient atmosphere.

15. The device according to claim 9, wherein only one or two magnetron magnet arrangement(s) (4) is/are provided for the sputtering cathode arrangement, wherein the cathode base bodies (2) with the targets (3) arranged thereon are movable relative to the magnetron magnet arrangements (4).

16. A method for coating a substrate (6) by means of cathode sputtering, by means of a sputtering cathode according to claim 1, wherein a stationary external magnetic field having magnetic field lines (8) extending essentially parallel with each other and in the plane of the substrate (6) is provided during sputtering.

17. A method for coating a substrate with several layers-with magnetic or magnetizable materials, in particular by means of the device according to claim 9, comprising the steps:
   (a) applying a layer on the substrate (6) by means of a sputtering cathode, wherein during sputtering a stationary external magnetic field having magnetic field lines (8) extending essentially parallel with each other in the same direction and in the plane of the substrate (6) is provided;
   (b) replacing the sputtering cathode with a different sputtering cathode;
   (c) optionally a translatory movement of a substrate relative to a sputtering cathode (1) essentially in the plane of the substrate (6) and essentially in the direction of the magnetic field lines (8) of the external magnetic field during step (a); and
   (d) repeating steps (a) to (c).

18. The method according to claim 17, thereby using a sputtering cathode comprising:
   a cathode base body (2);
   a target (3) arranged thereon;
   a magnet arrangement (4) provided behind the target (3) and intended for generating a magnetron field; and
   a means (5) for generating a stationary external magnetic field having magnetic field lines (8) which extend essentially parallel with each other in the same direction and essentially in the plane of the substrate (6),
   wherein during coating, the substrate (6) can be moved in its plane with respect to the target (3) essentially in the direction of the magnetic field lines (8) of the external magnetic field.

19. The method according to claim 16, wherein movement speed of the substrate (6) in the substrate plane is controlled during the application of the layer by means of cathode sputtering, depending on the desired layer thickness.

* * * * *